United States Patent
Matsuo et al.

(10) Patent No.: US 8,098,312 B2
(45) Date of Patent: Jan. 17, 2012

(54) BACK-ILLUMINATED TYPE SOLID-STATE IMAGE PICKUP APPARATUS WITH PERIPHERAL CIRCUIT UNIT

(75) Inventors: Mie Matsuo, Kanagawa (JP); Sachiyo Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 502 days.

(21) Appl. No.: 12/404,675

(22) Filed: Mar. 16, 2009

(65) Prior Publication Data

US 2009/0295979 A1     Dec. 3, 2009

(30) Foreign Application Priority Data

May 29, 2008  (JP) .................................. 2008-141304

(51) Int. Cl.
*H04N 3/14* (2006.01)
*H04N 5/225* (2006.01)

(52) U.S. Cl. .......................... 348/294; 348/297; 348/335

(58) Field of Classification Search ......................... None
See application file for complete search history.

(56) References Cited

U.S. PATENT DOCUMENTS

| | | | | |
|---|---|---|---|---|
| 7,339,256 B2 * | 3/2008 | Nakamura et al. | ........... | 257/659 |
| 7,812,874 B2 * | 10/2010 | Iwabuchi et al. | ........... | 348/294 |
| 2003/0201450 A1 | 10/2003 | Yamazaki et al. | | |
| 2005/0056902 A1 | 3/2005 | Abe et al. | | |
| 2006/0023109 A1 * | 2/2006 | Mabuchi et al. | ........... | 348/340 |
| 2006/0086956 A1 | 4/2006 | Furukawa et al. | | |
| 2007/0091190 A1 * | 4/2007 | Iwabuchi et al. | ........... | 348/294 |
| 2008/0102554 A1 | 5/2008 | Abe et al. | | |
| 2010/0019340 A1 * | 1/2010 | Shibayama | ........... | 257/434 |
| 2010/0045834 A1 * | 2/2010 | Iwabuchi et al. | ........... | 348/300 |
| 2010/0308386 A1 * | 12/2010 | Abe et al. | ........... | 257/292 |
| 2011/0164159 A1 * | 7/2011 | Ohgishi | ........... | 348/298 |

FOREIGN PATENT DOCUMENTS

| | | |
|---|---|---|
| JP | 4-235475 | 8/1992 |
| JP | 2005-217439 | 8/2005 |
| JP | 2006-120805 | 5/2006 |
| JP | 2007-178987 | 7/2007 |

\* cited by examiner

*Primary Examiner* — Lin Ye
*Assistant Examiner* — John H Morehead, III
(74) *Attorney, Agent, or Firm* — Oblon, Spivak, McClelland, Maier & Neustadt, L.L.P.

(57) ABSTRACT

A solid-state image pickup apparatus includes an image pickup pixel unit in which a plurality of pixels each including a photoelectric conversion element and a field-effect transistor are arranged on a semiconductor substrate so that a light-receiving surface is disposed at a first surface side of the semiconductor substrate; a peripheral circuit unit provided at a periphery of the image pickup pixel unit of the semiconductor substrate; and a multilayered wiring layer in which a plurality of wiring layers for driving the field-effect transistor of the image pickup pixel unit are laminated at a second surface side of the semiconductor substrate, wherein a wiring in each of the wiring layers constituting the multilayered wiring layer is disposed so that a coverage of the wiring located at least in the image pickup pixel unit of the semiconductor substrate reaches 100%, viewed from the second surface side.

17 Claims, 13 Drawing Sheets

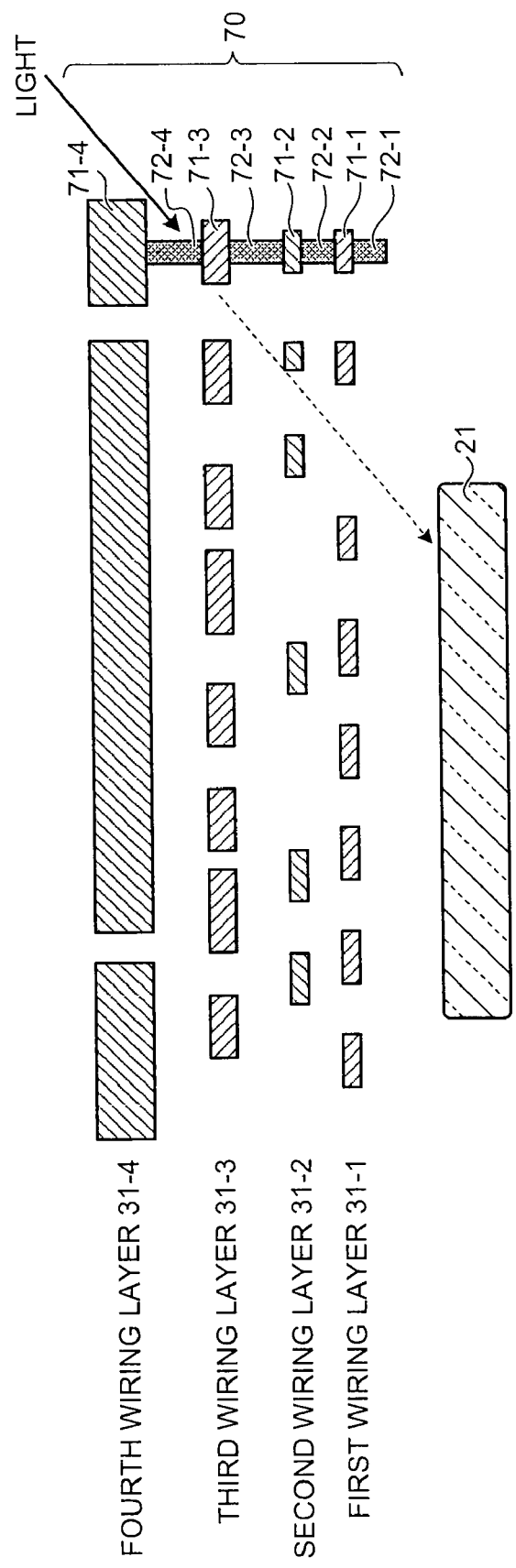

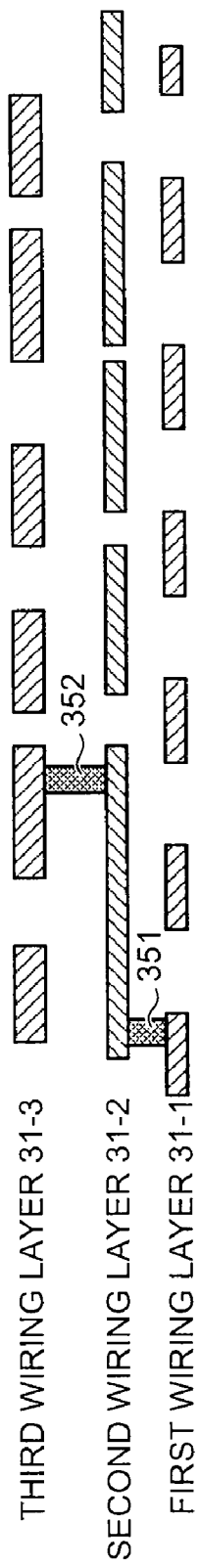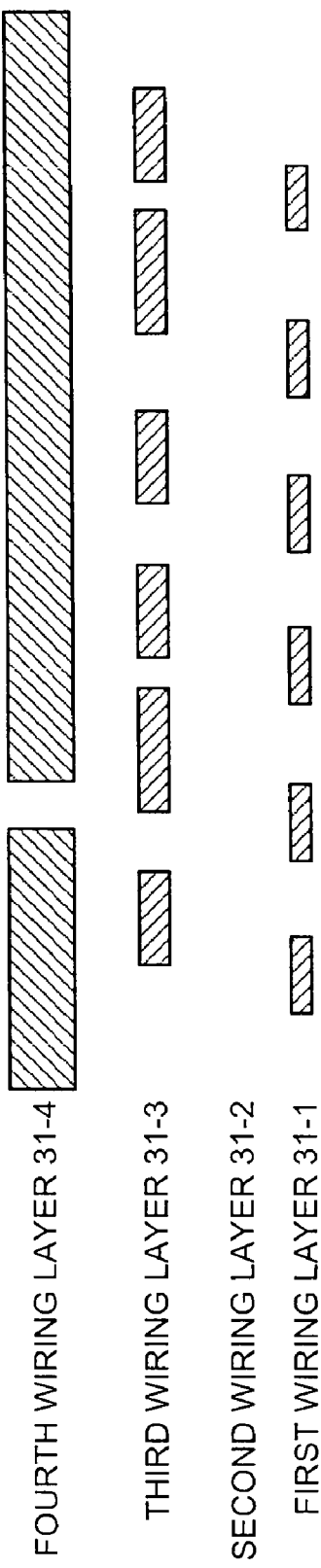

BACK-ILLUMINATED TYPE SOLID-STATE IMAGE PICKUP APPARATUS WITH PERIPHERAL CIRCUIT UNIT

CROSS-REFERENCE TO RELATED APPLICATIONS

This application is based upon and claims the benefit of priority from the prior Japanese Patent Application No. 2008-141304, filed on May 29, 2008; the entire contents of which are incorporated herein by reference.

BACKGROUND OF THE INVENTION

1. Field of the Invention

The present invention relates to a back-illuminated type solid-state image pickup apparatus and a camera module.

2. Description of the Related Art

In recent years, video cameras and electronic cameras have been spread widely. A charge coupled device (CCD) solid-state image pickup element and an amplification type solid-state image pickup element (complementary metal oxide semiconductor (CMOS) image sensor) have been used for the cameras. Particularly, with the spread of portable electronic equipments including a camera module such as a notebook personal computer, there is an increased demand for reducing the size, the weight, the thickness, and the cost of the camera module.

In general, a solid-sate image pickup apparatus has a chip which is formed by arranging photoelectric conversion elements, an amplifying circuit, and a multilayered wiring layer formed with a microlens and a color filter thereon, on a silicon substrate. A cover glass is bonded on a first main surface (light-receiving surface) of the chip, interposing a spacer such as an adhesive therebetween. A terminal is provided on a second main surface side of the chip. A camera module has a configuration in which a lens, a filter, and the like are assembled, hardened by resin, and packaged, on the cover glass of the solid-state image pickup apparatus. The camera module is also mounted on a mounting substrate.

In a conventional solid-state image pickup apparatus, a photoelectric conversion element is formed on a substrate, and a multilayered wiring layer is formed thereon. However, in such a structure, light incident on the front surface side of the substrate is shielded by the multilayered wiring layer and the like. Accordingly, a sufficient focusing property cannot be obtained. Subsequently, in recent years, a back-illuminated type solid-state image pickup apparatus that allows light incident on the rear surface side of the substrate and carries out photoelectric conversion in the substrate has been produced (see for example, JP-A 2006-120805 (KOKAI)). The back-illuminated type solid-state image pickup apparatus includes a photoelectric conversion element that receives light entering from the rear surface (light-receiving surface) of a silicon substrate and performs photoelectric conversion, and various field-effect transistors that amplify and transfer signal charges accumulated in the photoelectric conversion element, and read out the signal charges, in a region on the front surface (surface opposite to the light-receiving surface) of the silicon substrate being isolated by an element isolation region. The back-illuminated type solid-state image pickup apparatus has a configuration in which a multilayered wiring layer is formed on the front surface of the silicon substrate where the photoelectric conversion element and the field-effect transistors are formed. In the disclosed conventional solid-state image pickup apparatus, to prevent the light entering from the side of the light-receiving surface from transmitting through the silicon substrate, being reflected on the multilayered wiring layer, and entering into the photoelectric conversion element, a transmission preventing film is provided at an interface between the silicon substrate and the multilayered wiring layer. The transmission preventing film prevents light entering from the side of the light-receiving surface and transmitted through the silicon substrate, from reaching to the wiring layer.

To meet the recent demand for reducing the size, the weight, and the thickness of electronic devices, for example, some electronic equipment such as a mobile phone is configured so that the solid-state image pickup apparatus and the camera module are mounted on a thin substrate, such as a flexible substrate. However, in the electronic equipment such as the mobile phone, many light generating sources such as a liquid crystal backlight and a button illumination light are used. Therefore, the light generated on the side surface and the rear surface of the solid-state image pickup apparatus and the camera module, mounted on the thin substrate such as the flexible substrate, sometimes enters into the photoelectric conversion element. As a result, there is a problem that the wirings at the front surface side (the side opposite to the light-receiving surface) are picked up by an image pickup element. Particularly, in the back-illuminated type solid-state image pickup apparatus, to incident light on the rear surface side, a silicon substrate is thinned approximately 5 to 10 micrometers, and at the front surface side (the side opposite to the light-receiving surface) thereof, those other than metal wirings are formed of an insulating material that transmits light. Accordingly, the light incident on the front surface side and the side surface side transmits through the multilayered wiring layer at the front surface side, and reaches the silicon substrate. Because light is not attenuated by the silicon substrate, the pickup of light other than the light from the subject has been a large issue.

In the conventional example, to prevent diffused reflection and the like from the rear surface (the side of the light-receiving surface), a transmission preventing film is provided on an interface between the silicon substrate and the multilayered wiring layer. The transmission preventing film prevents the light incident on the side of the light-receiving surface from transmitting through the side of the multilayered wiring layer. However, a configuration to prevent light incident on the surface opposite to the rear surface (front surface side, in other words, the side of multilayered wiring layer) has not been focused. Accordingly, in the configuration of the disclosed conventional solid-state image pickup apparatus in which the transmission preventing film is only formed at the photoelectric conversion element, the source/drain regions of and transistors, and the upper surface of the gate electrode, there is a problem that light incident from an oblique direction cannot be prevented from entering into the photoelectric conversion element, in the other regions where the transmission preventing film is not formed, for example, in the element isolation region.

BRIEF SUMMARY OF THE INVENTION

A solid-state image pickup apparatus according to an embodiment of the present invention comprises an image pickup pixel unit in which a plurality of pixels each including a photoelectric conversion element and a field-effect transistor are arranged on a semiconductor substrate so that a light-receiving surface is disposed at a first surface side of the semiconductor substrate; a peripheral circuit unit provided at a periphery of the image pickup pixel unit of the semiconductor substrate; and a multilayered wiring layer in which a plurality of wiring layers for driving the field-effect transistor of the image pickup pixel unit are laminated at a second surface side of the semiconductor substrate, wherein a wiring in each of the wiring layers constituting the multilayered wiring layer is disposed so that a coverage of the wiring located at least in the image pickup pixel unit of the semiconductor substrate reaches 100%, viewed from the second surface side.

A solid-state image pickup apparatus according to an embodiment of the present invention comprises an image pickup pixel unit in which a plurality of pixels each including a photoelectric conversion element and a field-effect transistor are arranged on a semiconductor substrate so that a light-receiving surface is disposed at a first surface side of the semiconductor substrate; a peripheral circuit unit provided at a periphery of the image pickup pixel unit of the semiconductor substrate; and a multilayered wiring layer in which a plurality of wiring layers for driving the field-effect transistor of the image pickup pixel unit are laminated at a second surface side of the semiconductor substrate, wherein a wiring in each of the wiring layers constituting the multilayered wiring layer is disposed so that a distance between adjacent wirings constituting the multilayered wiring layer sandwiching a region not covered by the wiring at least in the image pickup pixel unit of the semiconductor substrate becomes equal to or less than a shortest wavelength of ultraviolet light, viewed from the second surface side.

A camera module according to an embodiment of the present invention comprises a solid-state image pickup apparatus; a cover glass provided at a first surface side of the solid-state image pickup apparatus; and a lens unit provided over the cover glass, wherein the solid-state image pickup apparatus includes an image pickup pixel unit in which a plurality of pixels each including a photoelectric conversion element and a field-effect transistor are arranged on a semiconductor substrate so that a light-receiving surface is disposed at a first surface side of the semiconductor substrate, a peripheral circuit unit provided at a periphery of the image pickup pixel unit of the semiconductor substrate, a multilayered wiring layer in which a plurality of wiring layers for driving the field-effect transistor of the image pickup pixel unit are laminated at a second surface side of the semiconductor substrate, a microlens provided corresponding to a forming position of the photoelectric conversion element of the image pickup pixel unit at the first surface side of the semiconductor substrate, and a light-shielding film formed corresponding to a forming position of the peripheral circuit unit at the first surface side of the semiconductor substrate, and wherein a wiring in each of the wiring layers constituting the multilayered wiring layer of the solid-state image pickup apparatus is disposed so that a distance between adjacent wirings constituting the multilayered wiring layer sandwiching a region not covered by the wiring at least in the image pickup pixel unit of the semiconductor substrate becomes equal to or less than a shortest wavelength of ultraviolet light, viewed from the second surface side.

BRIEF DESCRIPTION OF THE DRAWINGS

FIG. 5 is a sectional view taken along the line A-A in FIG. 4;

FIG. 7A is a sectional view taken along the line B-B in FIG. 6G;

FIG. 7B is a sectional view taken along the line C-C in FIG. 6G;

DETAILED DESCRIPTION OF THE INVENTION

Exemplary embodiments of a solid-state image pickup apparatus and a camera module according to the present invention are described below in detail with reference to the accompanying drawings. However, the present invention is not limited to the embodiments. The sectional views of the solid-state image pickup apparatus and the camera module used in the following embodiments are schematic, and the relationship between the thickness and the width of a layer, and the ratio of the thickness of each layer, for example, are different from those of the actual ones. The thickness of the layers shown below is only an example, and is not limited thereto.

Figure 1:
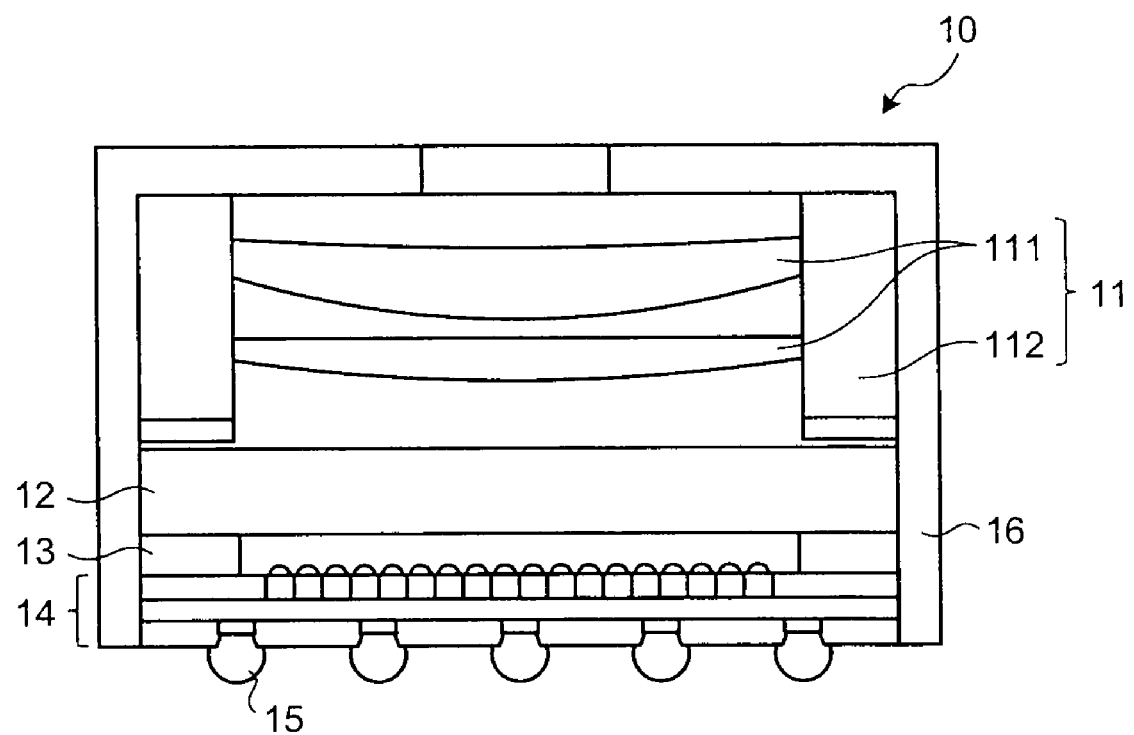
FIG. 1 is a schematic sectional view of an example of a camera module to which a solid-state image pickup apparatus according to an embodiment of the present invention is applied.
Figure 2:
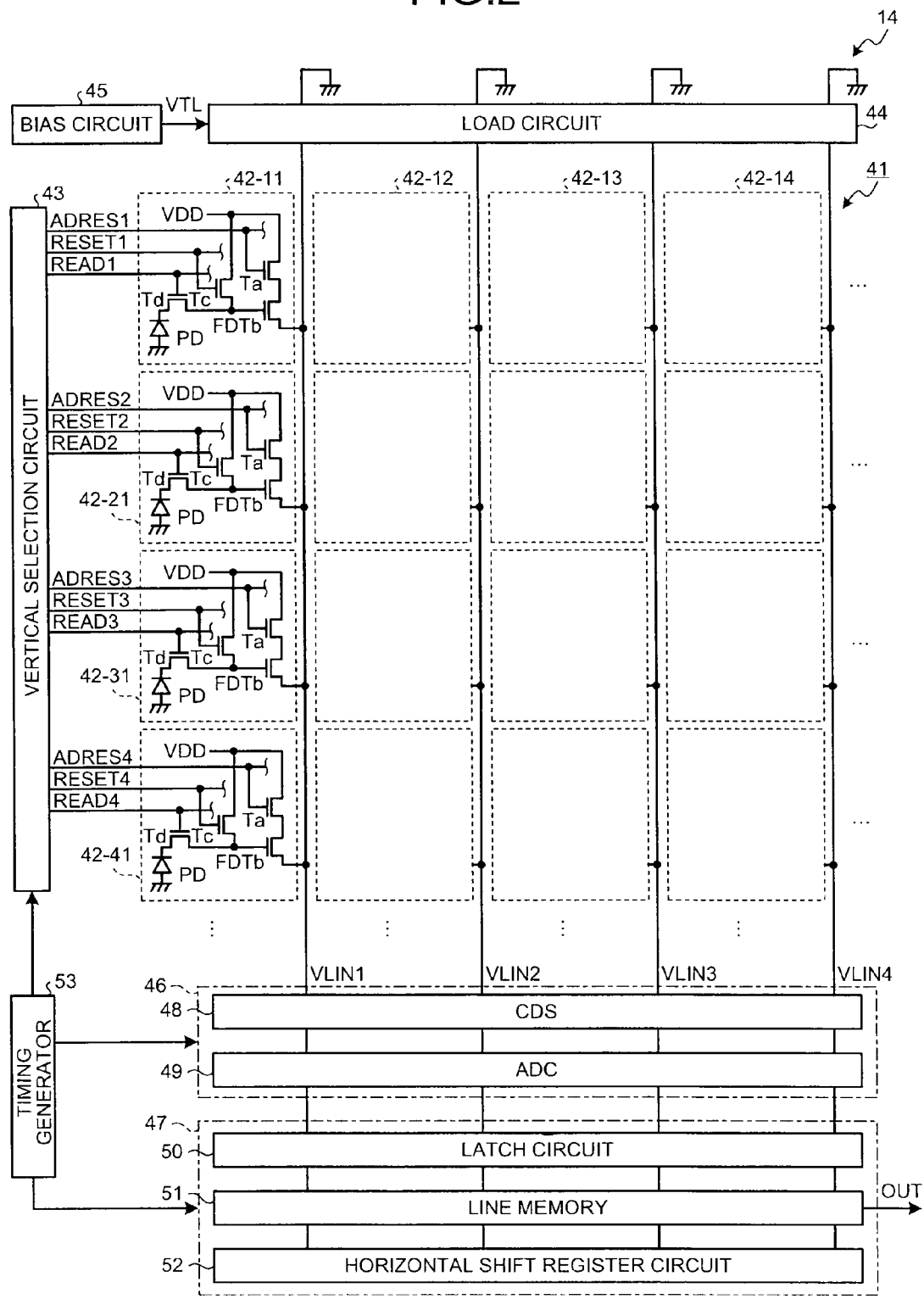
FIG. 2 is a schematic view of an example of a circuit configuration of the solid-state image pickup apparatus.

FIG. 1 is a schematic sectional view of an example of a camera module to which a solid-state image pickup apparatus according to an embodiment of the present invention is applied. FIG. 2 is a schematic view of an example of a circuit configuration of the solid-state image pickup apparatus. A camera module 10 includes a cover glass 12 and a back-illuminated type solid-state image pickup apparatus 14 formed of a complementary metal-oxide semiconductor (CMOS) image sensor chip, under a lens unit 11 having a lens 111 held in a lens holder 112. The camera module 10 also includes a casing 16 that fixedly holds the lens unit 11, the cover glass 12, and the solid-state image pickup apparatus 14. Solder balls 15, which are external connection terminals, are formed at a lower surface opposite to a light-receiving surface of the solid-state image pickup apparatus 14. The cover glass 12 is fixed to the side of the light-receiving surface of the solid-state image pickup apparatus 14 by an adhesive 13, and protects the side of the light receiving surface of the solid-state image pickup apparatus 14.

As shown in FIG. 2, the solid-state image pickup apparatus 14 includes therein an image pickup pixel unit 41 and a peripheral circuit unit of the image pickup pixel unit 41. The image pickup pixel unit 41 is arranged with pixels 42-11, 42-12, to 42-mn (m and n being natural numbers) disposed in a two-dimensional array of m rows and n columns. The detailed circuit configuration is described here, by extracting four pixels from the image pickup pixel unit 41. Vertical data lines VLIN1, VLIN2, VLIN3, and so on, are connected to each pixel column in the image pickup pixel unit 41.

Each of the pixels 42-11, 42-12 to 42-mn includes four field-effect transistors (a row-select transistor Ta, an amplifying transistor Tb, a reset transistor Tc, and a read-out transistor Td), and a photodiode PD that is a photoelectric conversion element. Taking the pixel 42-11 as an example, current paths of the transistors Ta and Tb are series connected between a power source VDD and the vertical data line VLIN1. An address pulse ADRES1 is supplied to a gate of the transistor Ta. A current path of the transistor Tc is connected between the power source VDD and a gate of the transistor Tb (a charge detecting unit FD), and a reset pulse RESET1 is supplied to the gate. An end of a current path of the transistor Td is connected to the charge detecting unit FD, and a read-out pulse READ1 is supplied to the gate. A cathode of the photodiode PD is connected to the other end of the current path of the transistor Td, and an anode of the photodiode PD is grounded.

A signal charge generated by the photodiode PD responds to the read-out pulse READ1, and is supplied to the charge detecting unit FD via the read-out transistor Td. The signal charge of the charge detecting unit FD is converted into an electric signal by the amplifying transistor Tb, and then amplified. When the row-select transistor Ta is selected by the address pulse ADRES1, a current corresponding to the amount of the signal charge is supplied to the vertical data line VLIN1 from the power source VDD. When the read-out is finished, the signal charge of the charge detecting unit FD responds to the reset pulse RESET1, and is reset by the reset transistor Tc.

The peripheral circuit unit includes a driving circuit that selects and drives the image pickup pixel unit 41, a signal processing circuit that processes pixel signals output from the image pickup pixel unit 41, a data holding circuit that holds data obtained from the signal processing circuit, and the like.

A vertical selection circuit 43 acts as a driving circuit that supplies pixel driving pulse signals such as the address pulses ADRES1, ADRES2, and so on, the reset pulses RESET1, RESET2, and so on, and the read-out pulses READ1, READ2, and so on, to each pixel row of the image pickup pixel unit 41, and selects and drives a pixel row.

A load circuit 44 is provided between an end of each of the vertical data lines VLIN1, VLIN2, VLIN3, and so on, and a ground point. A bias voltage VTL is applied to the load circuit 44, from a bias circuit 45. The bias voltage VTL sets the amount of current that flows through the vertical data lines VLIN1, VLIN2, VLIN3, and so on.

A signal processing circuit 46 and a data holding circuit 47 are provided at the other end of the vertical data lines VLIN1, VLIN2, VLIN3, and so on. The signal processing circuit 46 includes a correlated double sampling (CDS) circuit 48 and an analog/digital converter (ADC) 49. The analog/digital converter 49 carries out analog/digital conversion on data read out from each of the pixels in the image pickup pixel unit 41 to the vertical data lines VLIN1, VLIN2, VLIN3, and so on. The correlated double sampling circuit 48 performs noise reduction processing while the read-out data is analog/digitally converted.

The data holding circuit 47 includes a latch circuit 50, a line memory 51, a horizontal shift register circuit 52, and the like, and holds digital data obtained through processing performed by the signal processing circuit 46. The latch circuit 50 latches the digital data obtained through analog/digital (A/D) conversion performed by the analog/digital converter 49. The horizontal shift register circuit 52 sequentially transfers digital data latched in the latch circuit 50. The line memory 51 stores therein the latched digital data, and outputs to the outside of the solid-state image pickup apparatus 14 as an output signal OUT.

The selection and driving operations of the image pickup pixel unit 41 performed by the vertical selection circuit 43, the operation performed by the signal processing circuit 46, the operation performed by the data holding circuit 47, and the like, are controlled by a timing signal output from a timing generator 53.

In such a configuration, a wiring layer that drives the field-effect transistors Ta, Tb, Tc, and Td in each of the pixels in the image pickup pixel unit 41 is formed on a front surface side (first surface side) of a semiconductor substrate of the solid-state image pickup apparatus 14 in FIG. 1. A light-receiving surface of the photodiode PD is disposed on a rear surface side (second surface side) of the semiconductor substrate of the solid-state image pickup apparatus 14. Light incident into the lens unit 11 is emitted on the light-receiving surface of the photodiode PD, formed in the solid-state image pickup apparatus 14 interposing the cover glass 12 therebetween. A light-shielding film (not shown) is formed on the rear surface side of the solid-state image pickup apparatus 14, corresponding to a non-light receiving region of the light-receiving surface (region where the peripheral circuit is disposed).

Figure 3:
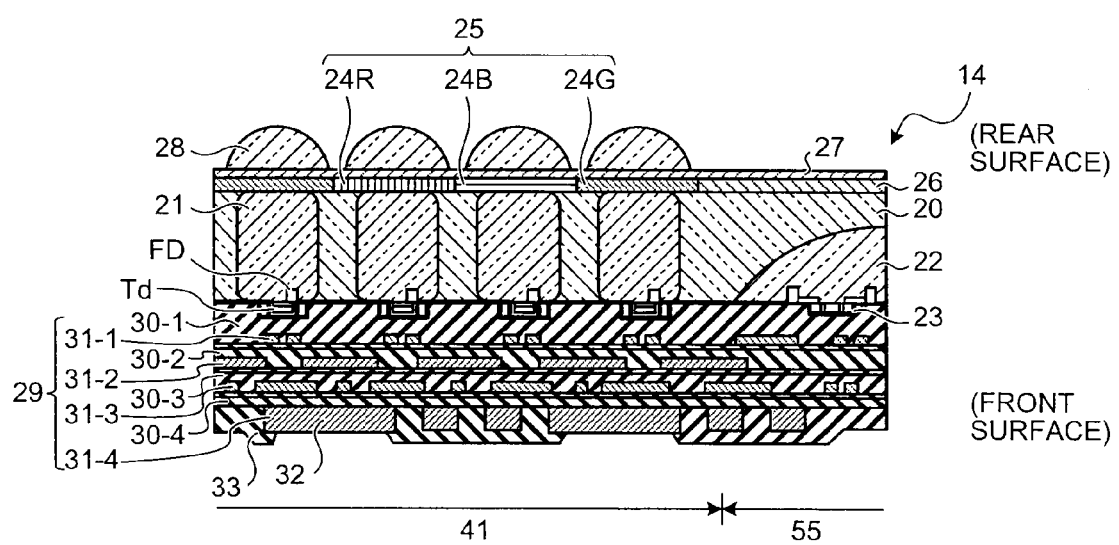
FIG. 3 is an enlarged sectional view of a part of the solid-state image pickup apparatus in the camera module in FIG. 1.

FIG. 3 is an enlarged sectional view of a part of the solid-state image pickup apparatus in the camera module in FIG. 1. A region including the image pickup pixel unit 41 that generates a signal for contributing to a formation of an image by receiving light, and a peripheral circuit unit 55 that processes the signal received from the image pickup pixel unit 41 is shown here.

The solid-state image pickup apparatus 14 includes the image pickup pixel unit 41 and the peripheral circuit unit 55. Photoelectric conversion elements 21 and field-effect transistors such as the read-out transistor Td are formed in a matrix in the image pickup pixel unit 41. Elements such as a field-effect transistor 23 are formed in the peripheral circuit unit 55. On a rear surface side of a silicon substrate 20 having a thickness equal to or less than 10 micrometers, more preferably from 5 to 10 micrometers, a color filter 25 and microlenses 28 are formed. A multilayered wiring layer 29 is formed on the front surface side thereof. The silicon substrate 20 is used to form the solid-state image pickup apparatus 14, but any substrate may be used as long as the substrate is a semiconductor substrate.

At the rear surface side of the silicon substrate 20 on a region corresponding to the image pickup pixel unit 41, the color filter 25 is formed. A red color pattern 24R, a blue color pattern 24B, and a green color pattern 24G are disposed in a predetermined sequence in a horizontal direction in the color filter 25, corresponding to the positions where the photoelectric conversion elements 21 are formed. A light-shielding film 26 made of an aluminum film or the like that prevents light from entering into the peripheral circuit unit 55 from the rear surface side, is provided on a region corresponding to the peripheral circuit unit 55. A passivation film 27 such as a silicon nitride film is provided on the entire surface of the color filter 25 of the image pickup pixel unit 41 and the light-shielding film 26 of the peripheral circuit unit 55. The microlenses 28 are provided corresponding to each of the positions on the color filter 25 of the image pickup pixel unit 41. One photoelectric conversion element 21 corresponds to one pixel, and the photoelectric conversion element 21 that gathered three pixels including the color patterns 24R, 24B, and 24G corresponds to one picture element that is the minimum unit of an image.

As shown in FIG. 1, the cover glass 12 is provided at the side of the microlenses 28 of the solid-state image pickup apparatus 14. The cover glass 12 and the solid-state image pickup apparatus 14 are fixed by the adhesive 13. The adhesive 13 is preferably made of a material that has a lower refractive index than that of each microlens 28. However, if a material whose refractive index is higher than that of the microlens 28 is used, only a region where the microlens 28 is formed may be removed by patterning, thereby forming a cavity.

The silicon substrate 20, for example, is formed of a P-type silicon substrate. In the image pickup pixel unit 41, N-type photoelectric conversion elements 21 penetrate through the silicon substrate 20, corresponding to the positions where the pixels are formed on the P-type silicon substrate 20. The charge detecting unit FD that detects a charge converted by the photoelectric conversion element 21 is provided at an area near the front surface side of the photoelectric conversion element 21. The read-out transistor Td that transfers charge signals from the photoelectric conversion element 21 to the charge detecting unit FD is provided on the front surface of the silicon substrate 20. The other field-effect transistors that form the pixel are not shown. In the peripheral circuit unit 55, a well 22 is formed at the front surface side of the silicon substrate 20. Elements such as the field-effect transistor 23 are provided on the well 22.

On the front surface of the silicon substrate 20 to which the field-effect transistors such as the read-out transistor Td of the image pickup pixel unit 41 and the field-effect transistor 23 of the peripheral circuit unit 55 are formed, the multilayered wiring layer 29 that connects between the elements formed on the silicon substrate 20, and with an external element is formed. In an example in FIG. 3, a first interlayer insulating film 30-1, a first wiring layer 31-1, a second interlayer insulating film 30-2, a second wiring layer 31-2, a third interlayer insulating film 30-3, a third wiring layer 31-3, a fourth interlayer insulating film 30-4, and a fourth wiring layer 31-4 are sequentially laminated and formed on the front surface of the silicon substrate 20. Pads 32 used to form external connection terminals such as solder balls are provided at the fourth wiring layer 31-4, and a region other than the pads 32 is coated with a heat-resisting coating material (solder resist) 33 so that the solder will not adhere.

In the first embodiment, with the multilayered wiring layer 29, when the front surface of the silicon substrate 20 is viewed from the surface side (front surface side) where the multilayered wiring layer 29 is formed, wirings of each of the wiring layers 31-1 through 31-4 are disposed, so that the coverage of the silicon substrate 20 by the wirings of each of the wiring layers 31-1 through 31-4 that form the multilayered wiring layer 29, reaches 100% at least at the front surface of the image pickup pixel unit 41 of the silicon substrate 20.

In the back-illuminated type solid-state image pickup apparatus 14, how the wirings are arranged in each of the wiring layers 31-1 through 31-4 is not limited, and it is possible to freely dispose the wirings as long as there is no problem with electricity. However, if only the wirings required to operate the solid-state image pickup apparatus 14 are arranged, a region not covered by the wirings appears on the front surface of the silicon substrate 20. Therefore, when such a camera module that includes the solid-state image pickup apparatus is mounted on electronic equipment such as a mobile phone as above-described, the light incident on the side surface and the front surface of the camera module (solid-state image pickup apparatus 14) enters into the photoelectric conversion element 21, by the light from the light generating source in the electronic equipment. Therefore, in the first embodiment, while only arranging the wirings required to operate the solid-state image pickup apparatus 14, when the front surface of the silicon substrate 20 is viewed from the surface side (front surface side) where the multilayered wiring layer 29 is formed, dummy wiring patterns are disposed at portions not covered by the wiring layers 31-1 through 31-4. The arrangement of the dummy wiring patterns can be suitably selected, so that the coverage of the front surface of the silicon substrate 20 by the wiring layers including the dummy wirings reaches 100%, because the multilayered wiring layer 29 is formed of a plurality of wiring layers 31-1 through 31-4.

A wiring material that can absorb or reflect light having a wavelength equal to or more than the shortest wavelength of ultraviolet light is used for the wiring layers 31-1 through 31-4. A metal material such as aluminum (Al), copper (Cu), titanium (Ti), titanium nitride (TiN), tantalum (Ta), tantalum nitride (TaN), and tungsten (W) used as a wiring material for a general large-scale integration (LSI), or a laminated film made of the metal materials may be used therefor. The metal materials have material characteristics that can shield light having a wavelength equal to or more than that of the ultraviolet light (300 nanometers), even with a single layer, if the thickness thereof is approximately 100 nanometers. Accordingly, it is possible to shield light by the thickness of the wirings generally being used. Because the light incident on the front surface side and the side surface side of the silicon substrate 20 is shielded, the thickness of each of the wiring layers 31-1 through 31-4 that form the multilayered wiring layer 29 need not be changed. Subsequently, it is only necessary to form the dummy wiring patterns.

Because of electrical constraints, it is not possible to completely shield the light incident on the front surface side and the side surface side of the silicon substrate 20 by one wiring layer. However, when the multilayered wiring layer 29 formed of wiring layers equal to or more than two is used, it is possible to interpolate the space between the wirings of the first wiring layer 31-1, with the wirings of the other wiring layer.

Figure 4:
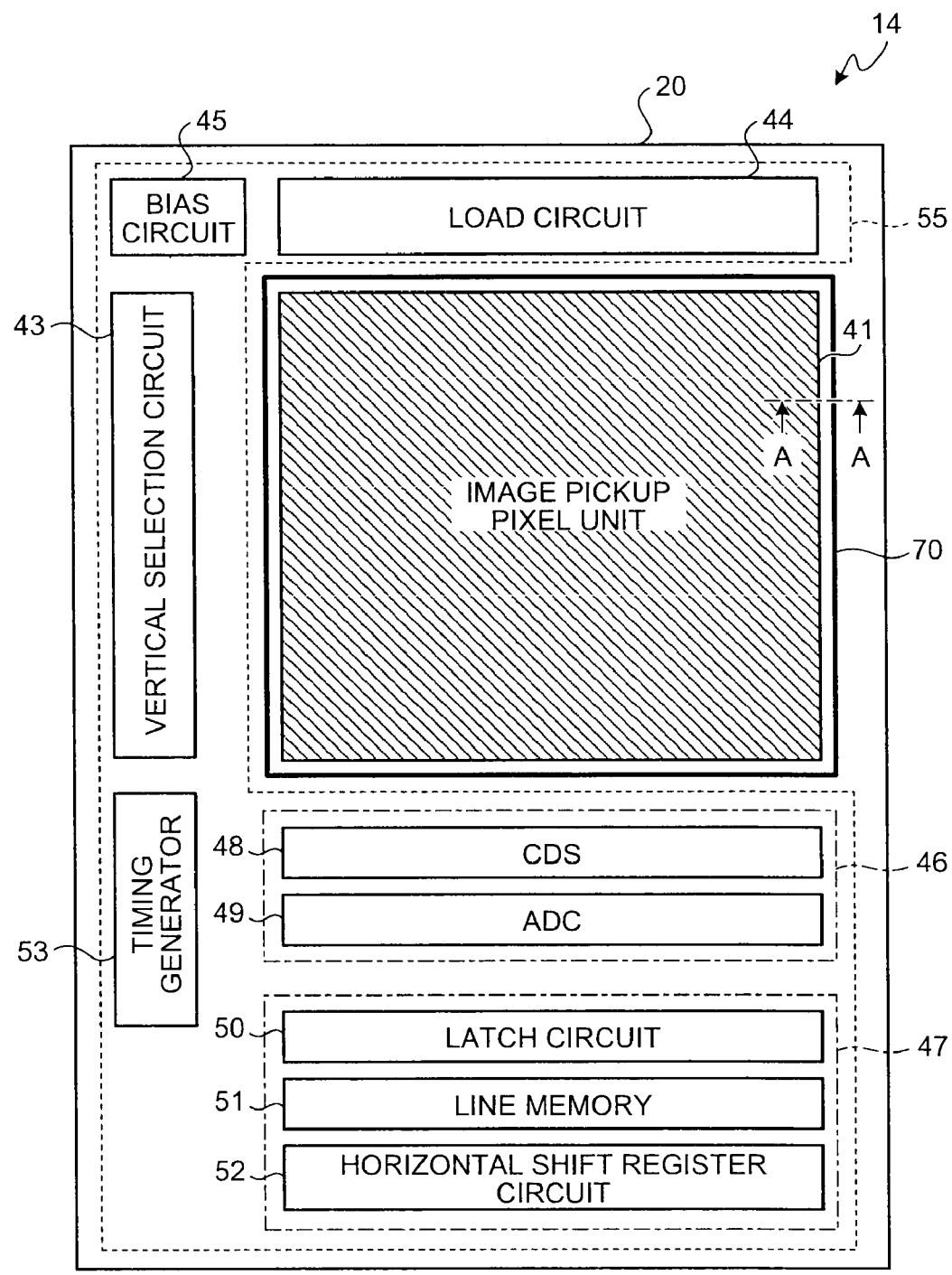
FIG. 4 is a schematic view of an example of a planar configuration of a solid-state image pickup apparatus according to a first embodiment.

FIG. 4 is a schematic view of an example of a planar configuration of a solid-state image pickup apparatus according to a first embodiment. FIG. 5 is a sectional view taken along the line A-A in FIG. 4. As shown in FIG. 4, in the solid-state image pickup apparatus 14, the image pickup pixel unit 41 on which pixels are disposed, is provided near the center of the silicon substrate 20. The peripheral circuit unit 55 such as the vertical selection circuit 43 and the load circuit 44 is formed at the periphery thereof. In FIG. 4, a crosshatched region indicates a region where the coverage by the wiring layers including the dummy wirings reaches 100%.

In the first embodiment, a via ring 70 is formed along the peripheral portion of the multilayered wiring layer 29 of the image pickup pixel unit 41. As shown in FIG. 5, the via ring 70 is a wall laminated with wirings 71-1 through 71-4 and plugs 72-1 through 72-4, formed on each of the wiring layers 31-1 through 31-4, and disposed at the periphery of the image pickup pixel unit 41. In FIG. 5, the wirings 71-1 through 71-4 and the plugs 72-1 through 72-4 that form the via ring 70 are sequentially formed in a direction perpendicular to a paper surface. At a portion between the image pickup pixel unit 41 and the peripheral circuit unit 55 where the wirings are formed, a wall structure is not formed near an area where the wirings are formed, and the via ring 70 is non-conductive with the wirings in the image pickup pixel unit 41. By providing such the via ring 70, it is possible to more effectively shield the light incident on the front surface side and the side surface side of the image pickup pixel unit 41. However, in the first embodiment, the light incident on the front surface side and the side surface side of the image pickup pixel unit 41 is already shielded, because the wirings and the dummy wiring patterns are disposed, so that the wiring coverage of the front surface of the silicon substrate 20 in the image pickup pixel unit 41 by the wiring layers including the dummy wirings reaches 100%. By providing the via ring 70 at the periphery of the image pickup pixel unit 41, it is possible to more certainly shield light entering especially from the side surface side of the image pickup pixel unit 41. However, if the light is sufficiently shielded by the wiring layers including the dummy wirings, it is possible to omit forming the via ring 70.

Figure 6A:
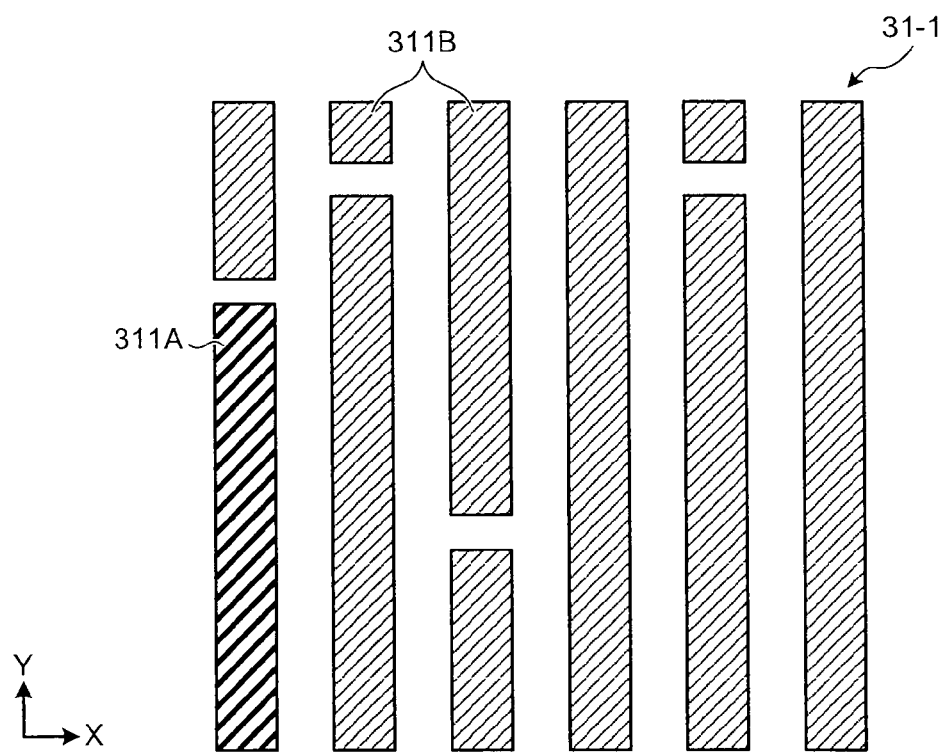
FIGS. 6A to 6G are schematic plan views of an example of a manufacturing procedure of the solid-state image pickup apparatus according to the first embodiment.
Figure 6B:
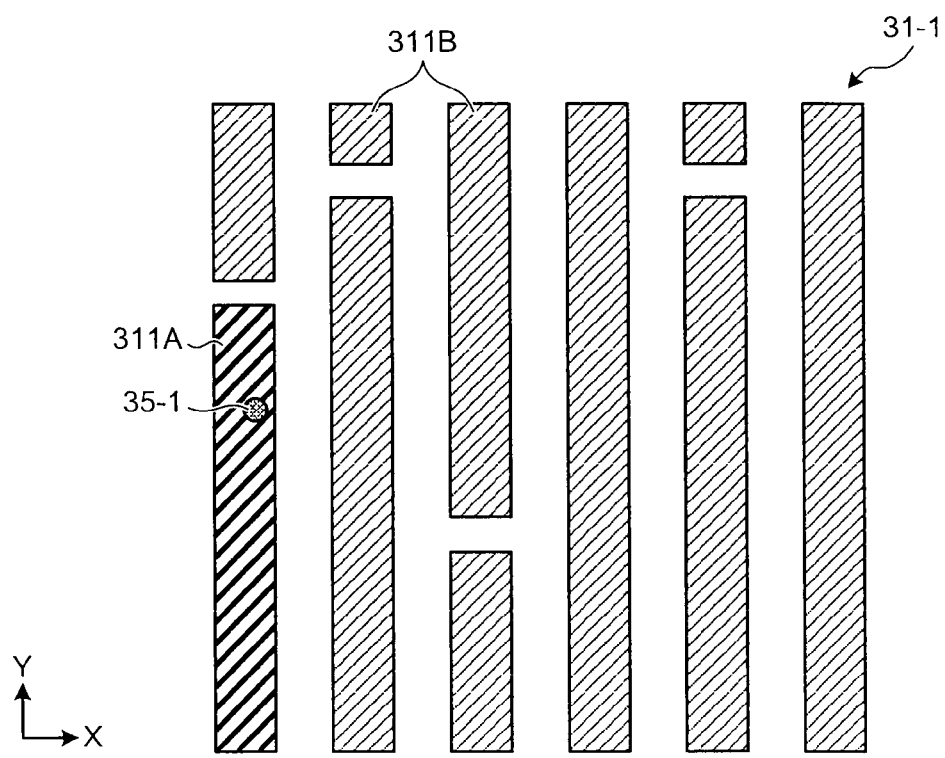
Figure 6C:
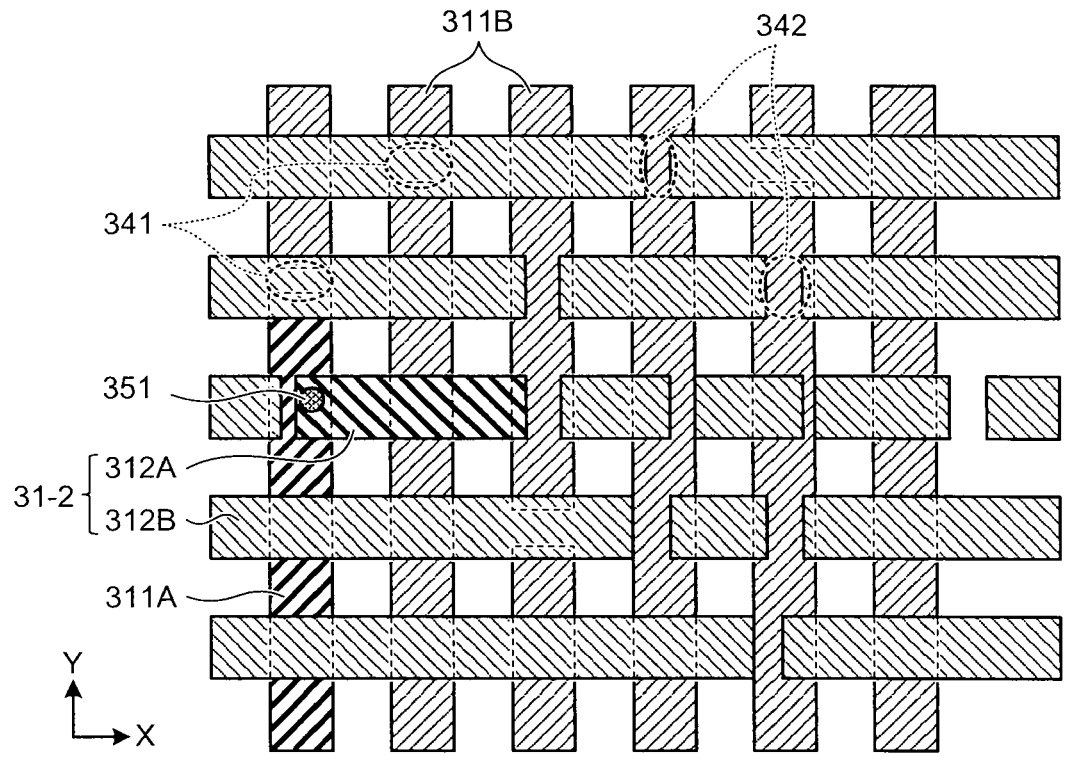

Next, a manufacturing method of the solid-state image pickup apparatus 14 having such a configuration will be described. FIGS. 6A to 6G are schematic plan views of an example of a manufacturing procedure of the solid-state image pickup apparatus according to the first embodiment. FIG. 7A is a sectional view taken along the line B-B in FIG. 6G, and FIG. 7B is a sectional view taken along the line C-C in FIG. 6G. In the following, only portions used to form the multilayered wiring layer 29 in the image pickup pixel unit 41 are shown, and other portions are omitted. In FIGS. 6A to 6G, a horizontal direction in the paper surface is an X-axis direction, and a direction perpendicular to the X-axis direction in the paper surface is a Y-axis direction. In FIGS. 6A to 6G, an interlayer insulating film is not shown. In the plan views of the multilayered wiring layers in FIGS. 6A to 6G, cross-hatching is applied to easily understand the overlapping relationship of the wiring layers.

On the front surface of the silicon substrate 20 on which the photoelectric conversion element 21 is provided in the region where the image pickup pixel unit 41 is to be formed, the read-out transistor Td that includes the charge detecting unit FD and the other field-effect transistors are formed. Then, on the front surface of the silicon substrate 20 where the field-effect transistors are provided, the first interlayer insulating film 30-1 is formed.

On the first interlayer insulating film 30-1, a metal material such as Al, Cu, Ti, TiN, Ta, TaN, and W, or a laminated film made of the metal materials is applied thereto. By using a photolithography technology and an etching technology, the first wiring layer 31-1 is formed by patterning into a predetermined shape extended in the Y-axis direction (FIG. 6A). A wiring 311A in the first wiring layer 31-1 is connected to an upper wiring so as to be electrically conducted, and the others are dummy wirings 311B. Although not shown, the wiring 311A is electrically connected to a lower field-effect transistor via a contact, which is not shown.

Figure 8A:
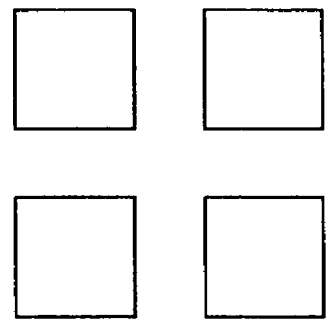
FIGS. 8A to 8C are plan views showing examples of shapes of dummy wirings.
Figure 8B:
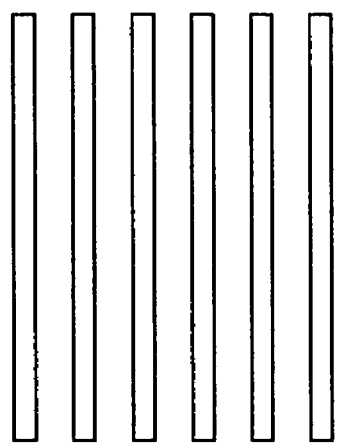
Figure 8C:
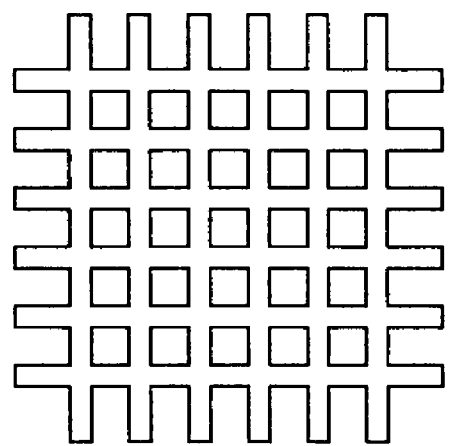

FIGS. 8A to 8C are plan views showing examples of shapes of dummy wirings. Various shapes can be used for the dummy wirings. For example, the dummy wirings in square dots as shown in FIG. 8A, the dummy wirings in line and space (L/S) of which rectangular wirings extended in one direction are disposed at predetermined intervals as shown in FIG. 8B, and the grid-like dummy wirings as shown in FIG. 8C may be used. The dummy wirings shaped as in FIGS. 8A and 8B can be used at various locations. The dummy wirings shaped as in FIG. 8C are effective to cover a predetermined area of a region where wiring is not at all formed. In examples shown in FIG. 6A and below, the dummy wirings in dots in FIG. 8A and the dummy wirings in line and space in FIG. 8B, are used for the dummy wirings.

Referring back to FIG. 6A, after forming the first wiring layer 31-1, a second interlayer insulating film, which is not shown, is formed on the first wiring layer 31-1. By using a photolithography technology and an etching technology, a via hole 35-1 is formed on a predetermined position where the wiring 311A is provided (FIG. 6B). At the bottom surface of the via hole 35-1, the wiring 311A of the first wiring layer 31-1 is exposed.

Then, on the second interlayer insulating film, a metal material such as Al, Cu, Ti, TiN, Ta, TaN, and W, or a laminated film made of the metal materials is applied thereto. By using a photolithography technology and an etching technology, the second wiring layer 31-2 is formed by patterning into a predetermined shape extended in the X-axis direction (FIG. 6C). At this time, the via hole 35-1 formed in the process of FIG. 6B is embedded with the metal material, and a via 351 that connects between the wiring 311A and a wiring 312A of the second wiring layer 31-2 is formed. The other wirings other than the wiring 312A connected to the via 351 in the second wiring layer 31-2, are dummy wirings 312B. In the second wiring layer 31-2, the dummy wirings 312B extended in the X-axis direction are disposed, so as to cover gaps 341 between the wirings in the Y-axis direction in the first wiring layer 31-1. Gaps 342 between the wirings in the X-axis direction, made by the wiring 312A and the dummy wirings 312B that form the second wiring layer 31-2 are designed, so that the most of them are positioned on the wiring 311A or the dummy wirings 311B of the first wiring layer 31-1.

Figure 6D:
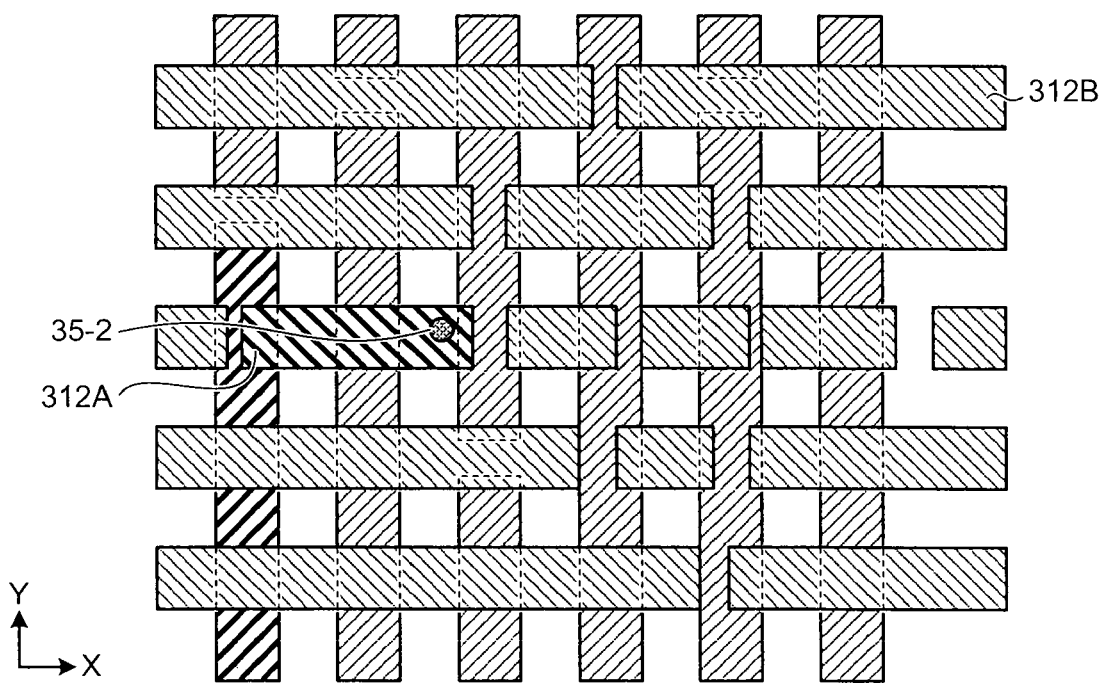

After forming a third interlayer insulating film, which is not shown, on the second wiring layer 31-2, by using a photolithography technology and an etching technology, a via hole 35-2 is formed on a predetermined position where the wiring 312A is formed (FIG. 6D). At the bottom surface of the via hole 35-2, the wiring 312A of the second wiring layer 31-2 is exposed.

Figure 6E:
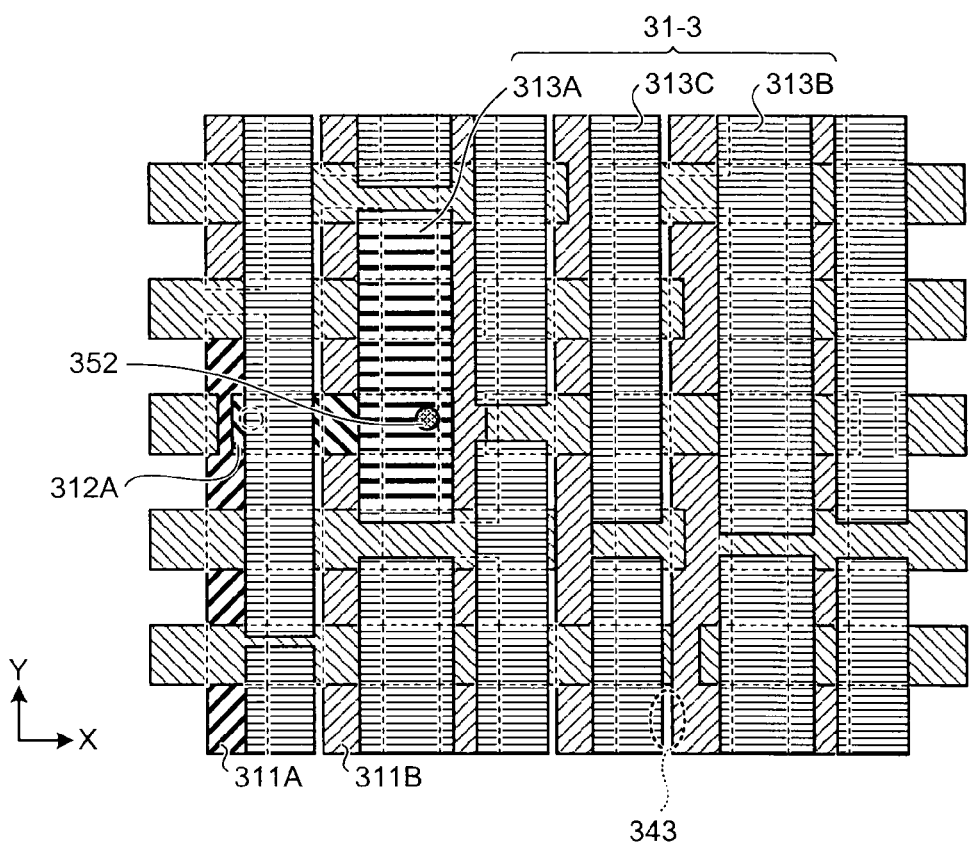

Then, on the third interlayer insulating film, a metal material such as Al, Cu, Ti, TiN, Ta, TaN, and W, or a laminated film made of the metal materials is applied thereto. By using a photolithography technology and an etching technology, the third wiring layer 31-3 is formed by patterning into a predetermined shape extended in the Y-axis direction (FIG. 6E). At this time, the via hole 35-2 formed in the process of FIG. 6D is embedded with the metal material, and a via 352 that connects between the wiring 312A and a wiring 313A of the third wiring layer 31-3 is formed. The wirings other than the wiring 313A connected to the via 352 in the third wiring layer 31-3, are dummy wirings 313B and 313C. In the third wiring layer 31-3, the wiring 313A and the dummy wirings 313B and 313C are formed, in the shape that the position thereof in the X-axis direction are shifted from that of the wiring 311A and the dummy wirings 311B of the first wiring layer 31-1, and extended in the Y-axis direction. There are wirings, such as the dummy wirings 313B, formed so as to cover all the gaps (wiring intervals) in the X-axis direction of the first wiring layer 31-1. There are also wirings, such as the dummy wirings 313C, formed so as not to cover all the gaps (wiring intervals) in the X-axis direction of the first wiring layer 31-1. Accordingly, regions 343 where a part of the front surface of the silicon substrate is not covered by the wirings are remained.

Figure 6F:
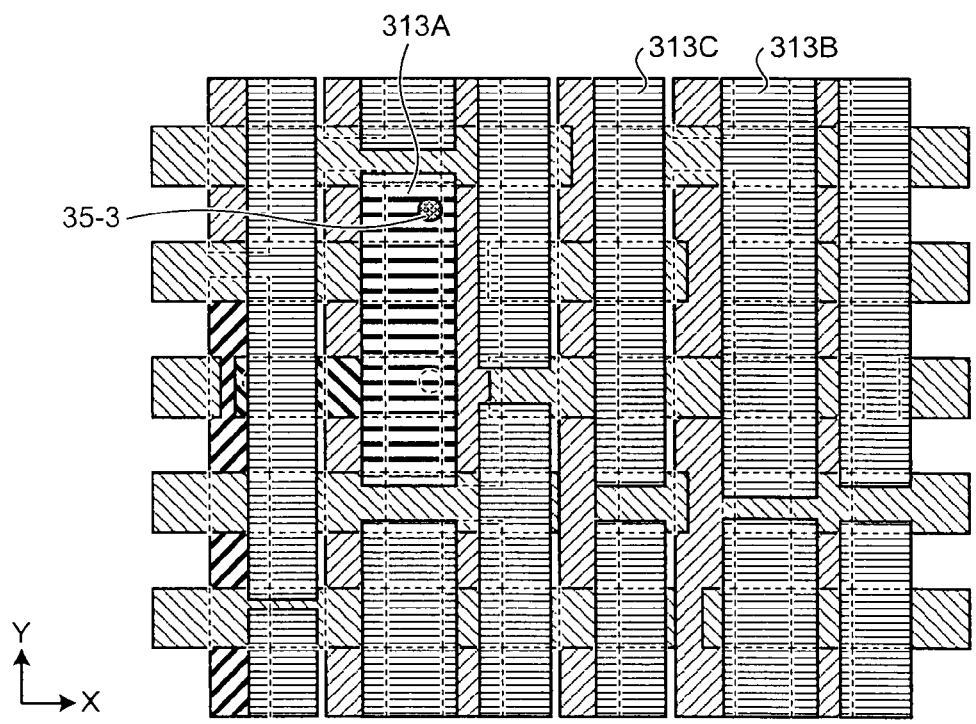
Figure 6G:
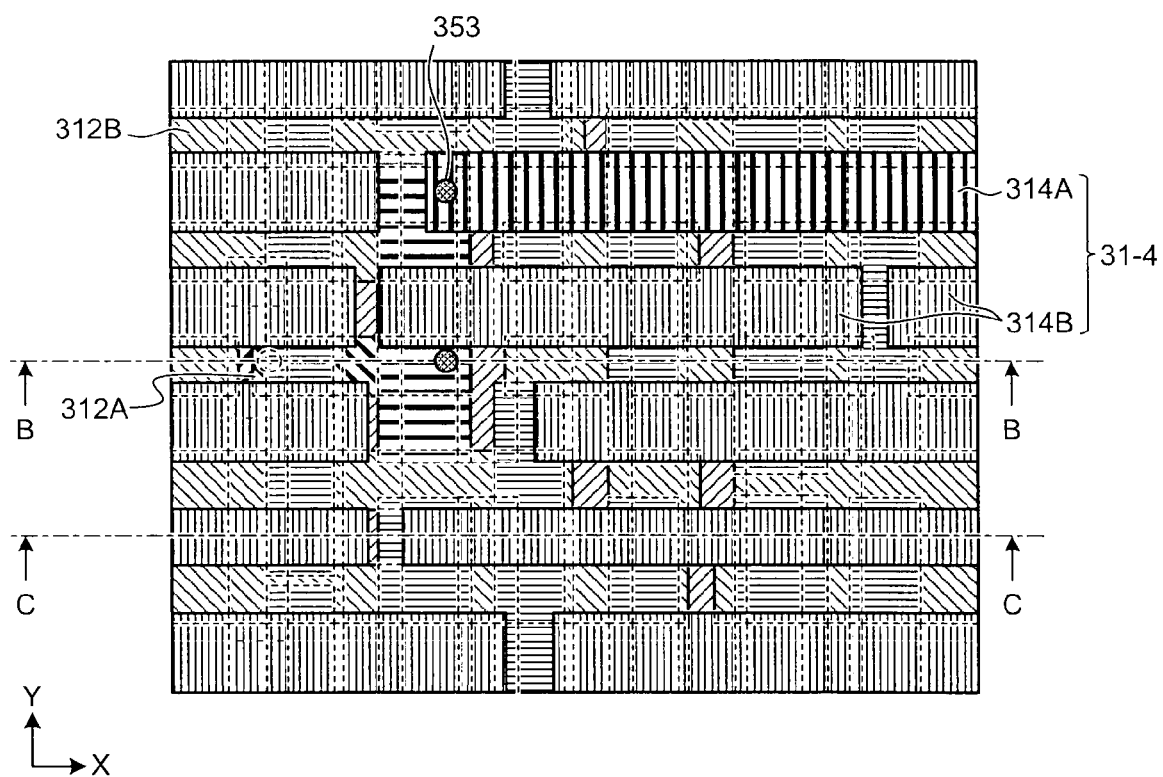

A fourth interlayer insulating film, which is not shown, is then formed on the third wiring layer 31-3. By using a photolithography technology and an etching technology, a via hole 35-3 is formed on a predetermined position where the wiring 313A is provided (FIG. 6F). At the bottom surface of the via hole 35-3, the wiring 313A of the third wiring layer 31-3 is exposed.

Then, on the fourth interlayer insulating film, a metal material such as Al, Cu, Ti, TiN, Ta, TaN, and W, or a laminated film made of the metal materials is applied thereto. By using a photolithography technology and an etching technology, the fourth wiring layer 31-4 is formed by patterning into a predetermined shape extended in the X-axis direction (FIG. 6G). At this time, the via hole 35-3 formed in the process of FIG. 6F is embedded with the metal material, and a via 353 that connects between the wiring 313A and a wiring 314A of the fourth wiring layer 31-4 is formed. The wirings other than the wiring 314A connected to the via 353 in the fourth wiring layer 31-4, are dummy wirings 314B. In the fourth wiring layer 31-4, the wiring 314A and the dummy wirings 314B are arranged, in the shape that the position thereof in the Y-axis direction are shifted from that of the wiring 312A and the dummy wirings 312B of the second wiring layer 31-2, and extended in the X-axis direction. Because the fourth wiring layer 31-4 is the top wiring layer in the multilayered wiring layer 29, it is formed so that the region on the front surface of the silicon substrate 20 not covered by the wirings up to the third wiring layer 31-3 is covered. Accordingly, for example, the positions where the wiring 314A and the dummy wirings 314B are formed and the diameter of the wiring (length in Y-axis direction) are determined, so that all the regions 343 where the front surface of the silicon substrate 20 is not covered by the wirings in FIG. 6E are covered. In this manner, the multilayered wiring layer 29 is formed.

As shown in FIG. 7A, in the sectional view taken along the line B-B in FIG. 6G, the wiring coverage by the first to the third wiring layers 31-1 through 31-3 reaches 100%, although the fourth wiring layer 31-4 is not formed. Therefore, the light entering from the position does not reach the silicon substrate.

Similarly, as shown in FIG. 7B, in the sectional view taken along the line C-C in FIG. 6G, the wiring coverage by the first, the third, and the fourth wiring layers 31-1, 31-3, and 31-4 reaches 100%, although the second wiring layer 31-2 is not formed. Accordingly, the light entering from the position also does not reach the silicon substrate.

In this manner, depending on the position, the wiring coverage of the front surface of the image pickup pixel unit 41 need not be 100%, by using all the wiring layers 31-1 through 31-4 that form the multilayered wiring layer 29. It is possible to include a region where the wiring coverage reaches 100%, by using at least two wiring layers that form the multilayered wiring layer 29.

After forming the multilayered wiring layer 29 in this manner, the region other than where the pads (solder balls) are formed on the fourth wiring layer 31-4 is covered by the heat-resisting coating material 33 such as a solder resist. The rear surface of the silicon substrate 20 is then polished into a predetermined thickness equal to or less than 10 micrometers. The light-shielding film 26 is formed on the rear surface of the region (peripheral circuit unit) excluding the image pickup pixel unit 41 of the thinly polished silicon substrate 20. The color filter 25 is formed corresponding to the position of each of the pixels on the image pickup pixel unit 41, and the passivation film 27 is formed on the color filter 25 and the light-shielding film 26.

By forming the microlenses 28 corresponding to the position of each of the pixels on the image pickup pixel unit 41, the solid-state image pickup apparatus 14 as shown in FIG. 3 can be obtained. To the solid-state image pickup apparatus 14 obtained in this manner, the adhesive 13 is applied to the side where the microlenses 28 are formed. The cover glass 12 is adhered thereon, and the solder balls 15 are then mounted on the pads 32 at the side where the multilayered wiring layer 29 of the solid-state image pickup apparatus 14 is formed. The above-described processes are performed on a plurality of regions formed on one silicon substrate 20 (wafer), and after the solder balls 15 are mounted on the silicon substrate 20, each of the regions are divided into individual pieces (chipped), by being diced. The lens unit 11 is disposed on the cover glass 12 of each chip being cut, and the camera module 10 as shown in FIG. 1 can be obtained by being packaged in a resin.

With the first embodiment, in the back-illuminated type solid-state image pickup apparatus, the wiring layers 31-1 through 31-4 that form the multilayered wiring layer 29 formed at the front surface side are disposed, so that the wiring coverage of the silicon substrate viewed from the front surface side reaches 100%, by using the dummy wirings in addition to the normal wirings. Accordingly, it is possible to shield unnecessary light entering into the photoelectric conversion element 21, from the side opposite to the light-receiving surface. Subsequently, it is possible to advantageously prevent the wirings at the front surface side from being picked up by the photoelectric conversion element 21.

In the first embodiment, the dummy wirings are disposed so that the wiring coverage at least at the image pickup pixel unit is 100%. However, with the light-shielding method using the dummy wirings, the wirings (metals) may be disposed at an interval equal to or less than the shortest wavelength of light, more specifically, the shortest wavelength of ultraviolet light (such as 300 nanometers) in the range where light is to be shielded, among the wavelengths of light incident on the front surface side. In other words, the wirings of each wiring layer that forms the multilayered wiring layer may be disposed, so that the interval between the adjacent wirings sandwiching a region not covered by the wirings that form the multilayered wiring layer, becomes equal to or less than the shortest wavelength of ultraviolet light. This is because light cannot transmit through a space smaller than the wavelength. By forming the multilayered wiring layer so that light does not reach the front surface of the silicon substrate according to such a rule, it is possible to shield light that has a wavelength equal to or more than the interval between the wirings, among rays of light entering from the side opposite to the light-receiving surface and the side surface side of the silicon substrate, even if the wiring coverage is not 100%. In this case, it is preferable to shield light by forming the dummy wiring patterns using the lower wirings (wiring layers close to the side of the silicon substrate to the wiring layers positioned at the middle) with the finer design rule.

To perform wiring in such a manner, a plurality of wirings (such as ADRES line, RESET line, and READ line) that extend in the same direction may sometimes be formed in the same wiring layer. As in the first embodiment, the multilayered wiring layer formed so that the coverage by the wirings in each of the wiring layers reaches 100% at design, may be shifted from the designed position when actually manufactured. In such an event, if the shifting range is equal to or less than the wavelength of ultraviolet light, it is still possible to shield light incident on the front surface side and the side surface side.

The second embodiment can produce the same advantages as those of the first embodiment.

In the first embodiment, the dummy wirings are disposed so that the wiring coverage at least in the image pickup pixel unit reaches 100%, and the via ring is formed at the periphery of the image pickup pixel unit. In a third embodiment, the via ring is not formed at the periphery of the image pickup pixel unit.

Figure 9:
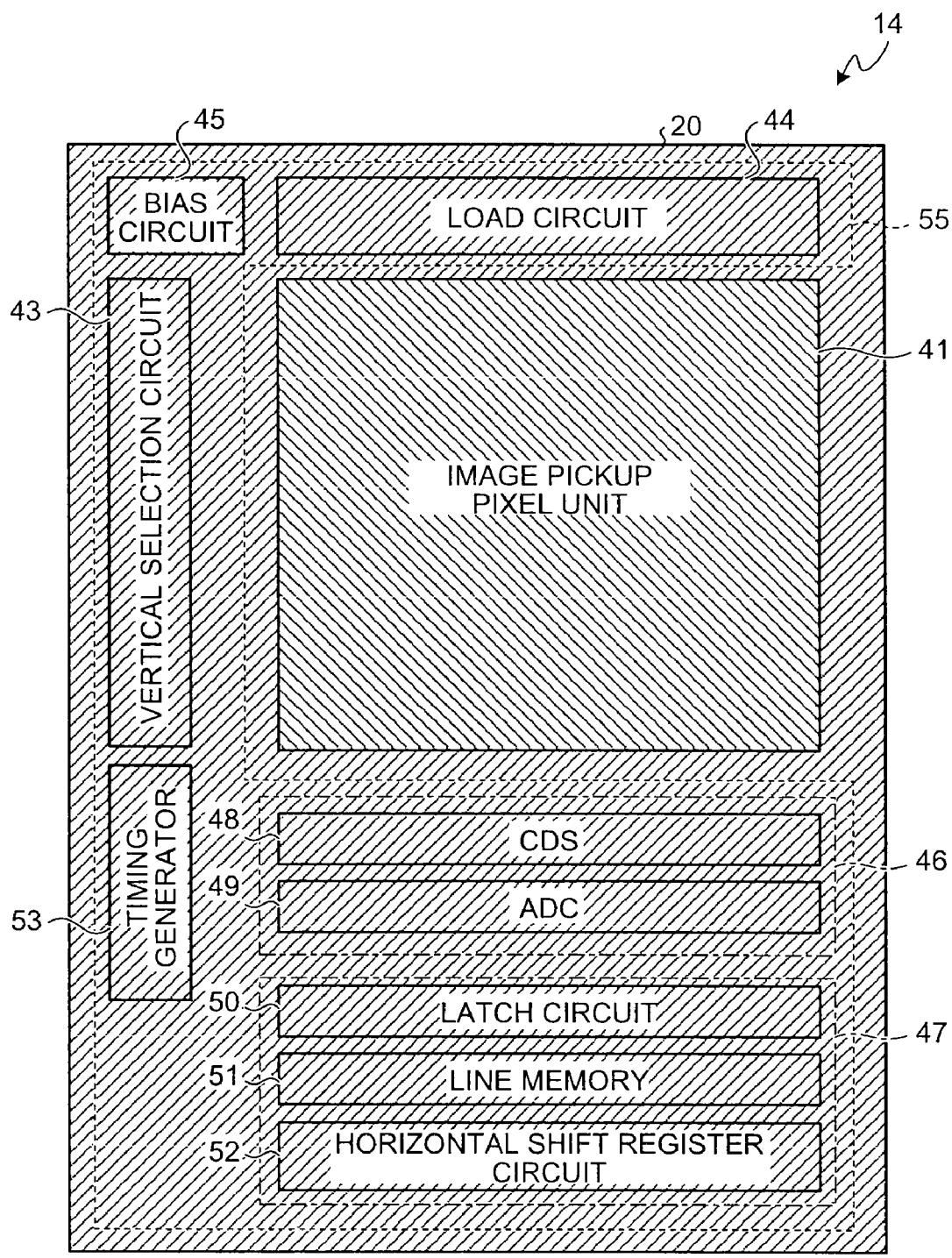
FIG. 9 is a schematic plan view showing the relationship of the wiring coverage in a solid-state image pickup apparatus according to a third embodiment.

FIG. 9 is a schematic plan view showing the relationship of wiring coverage in a solid-state image pickup apparatus according to a third embodiment. As shown in FIG. 9, the wirings are disposed so that the wiring coverage in the image pickup pixel unit 41 reaches 100%. The wirings are also disposed so that the wiring coverage in the peripheral circuit unit 55 also reaches 100%, or at the region on the silicon substrate 20 where wirings are not formed, the wirings or the dummy wirings are formed under the condition that the interval between the adjacent wirings is equal to or less than the wavelength of ultraviolet light. The cross-hatching in FIG. 9 indicates a region where the coverage by the wiring layers including the dummy wirings reaches 100%, or a region where the wirings or the dummy wirings are formed under the condition that the interval between the adjacent wirings is equal to or less than the wavelength of ultraviolet light.

In this manner, not only the image pickup pixel unit 41, but also the peripheral circuit unit 55 is formed, so as to shield light incident on the front surface side and the side surface side of the solid-state image pickup apparatus 14. Accordingly, it is possible to more certainly prevent light from entering into the photoelectric conversion element of the image pickup pixel unit 41, even if the via ring is not formed at the periphery of the image pickup pixel unit 41.

In this manner, by not only covering the image pickup pixel unit 41 but also the entire silicon substrate 20 including the peripheral circuit unit 55 with the wirings and the dummy wirings, it is possible to make the coverage of wirings on the silicon substrate 20 uniform. As a result, it is possible to prevent the occurrence of cracks in the insulating film of the multilayered wiring layer, and an interface debonding. The advantages will now be described in detail.

The silicon substrate 20 (multilayered wiring layer) includes a region where wirings are densely formed and a region where wirings are sparsely formed, and the wirings are formed of Cu. The third embodiment is described by comparing therewith. Cu is a material having a high thermal expansion coefficient and a large Young's modulus (hard and elastic material). On the contrary, a general insulating film that forms the interlayer insulating film is a material having a low thermal expansion coefficient and a small Young's modulus (soft and non-elastic material). Accordingly, when thermal stress and external stress are applied to the silicon substrate 20 during packaging when the silicon substrate 20 is thinned or divided into pieces, or during mounting the camera module 10 assembled by packaging the solid-state image pickup apparatus 14 on the substrate, the patterns are distorted on the silicon substrate 20 that has a portion with dense wiring and a portion with sparse wiring. Subsequently, cracks are created near the boundary.

However, as described above, by nearly making the coverage of wirings on the silicon substrate 20 uniform, even if the heat stress and the external stress are applied to the silicon substrate 20 during packaging or mounting, the thermal load and the external load applied to the entire silicon substrate 20 are made uniform, thereby preventing warpage of the chip.

With the third embodiment, not only the image pickup pixel unit 41, but also the peripheral circuit unit 55 is formed so as to shield light incident on the front surface side and the side surface side of the solid-state image pickup apparatus 14. Accordingly, it is possible to more certainly prevent light from entering into the photoelectric conversion element, from the front surface side and the side surface side of the image pickup pixel unit 41, without forming the via ring at the periphery of the image pickup pixel unit 41. The wirings and the dummy wirings are also disposed so that the wiring coverage not only of the image pickup pixel unit 41, but also of the entire silicon substrate 20, is made uniform. Accordingly, the stiffness of the solid-state image pickup apparatus 14 is increased, and the thermal load and the external load generated during mounting and packaging are made uniform, thereby preventing warpage of the solid-state image pickup apparatus 14. As a result, the performance of the solid-state image pickup apparatus 14 can be improved, and the problems such as cracks in the insulating film and interface debonding can be prevented at the same time. Accordingly, it is possible to advantageously obtain a high-quality and highly reliable solid-state image pickup apparatus 14.

In the multilayered wiring layer, the reduction of the dielectric constant of the interlayer insulating film has been desired, to reduce the parasitic capacitance between multilayered wirings. However, in general, a low-dielectric constant film has a small Young's modulus, and by comparing with the metal material (such as Cu) that forms the wiring layer, the Young's modulus is smaller by more than one order of magnitude. When the Young's modulus becomes smaller, there is a problem that the mechanical strength of the material of the low-dielectric constant film and the adhesion strength of the interface between the laminated films including the low-dielectric constant film deteriorate. When an interlayer insulating film is actually formed by using the low-dielectric constant film having a low relative dielectric constant, the problems such as cracks and interface debonding may occur in the interlayer insulating film of the solid-state image pickup apparatus. Accordingly, a material having a high relative dielectric constant such as a silicon oxide film and a silicon nitride film has been used for the interlayer insulating film in the multilayered wiring layer. In a fourth embodiment, a configuration that can prevent problems such as cracks and interface debonding in the interlayer insulating film of the solid-state image pickup apparatus, even if a material having a small relative dielectric constant is used for the interlayer insulating film in the multilayered wiring layer of the solid-state image pickup apparatus, will be described.

As shown in the third embodiment, the wiring coverage of the entire solid-state image pickup apparatus is substantially made uniform, by making not only the image pickup pixel unit, but also the peripheral circuit unit to shield light incident on the front surface side. In other words, the structure that the wirings are densely formed or sparsely formed, depending on the location of the solid-state image pickup apparatus can be solved, and by using the dummy wirings, substantially the same wiring coverage can be obtained at any location in the solid-state image pickup apparatus. As a result, thermal stress and external stress applied to the solid-state image pickup apparatus during mounting and packaging are made uniform. Accordingly, the interlayer insulating film does not need to be formed by a material having a high relative dielectric constant and a large Young's modulus as that of a conventional one. Subsequently, at least one of the interlayer insulating films that form the multilayered wiring layer can be formed using a low dielectric constant film whose relative dielectric constant is equal to or less than 3.4.

Figure 10:
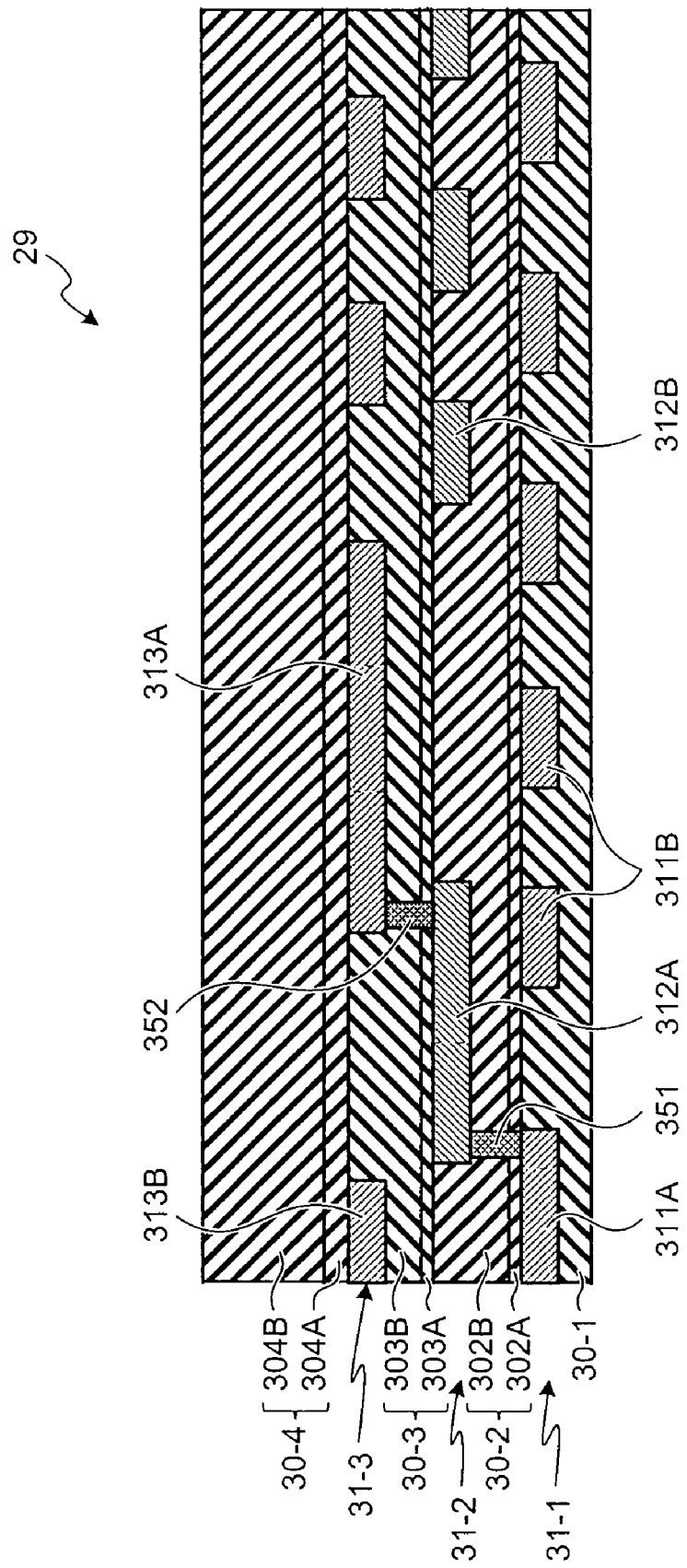
FIG. 10 is a schematic sectional view of a configuration of a multilayered wiring layer of a solid-state image pickup apparatus according to a fourth embodiment.

FIG. 10 is a schematic sectional view of a configuration of a multilayered wiring layer of a solid-state image pickup apparatus according to a fourth embodiment. The multilayered wiring layer 29 includes the first to third wiring layers 31-1 through 31-3, the first to fourth interlayer insulating films 30-1 through 30-4 formed above and below the first to third wiring layers 31-1 through 31-3. At least one of the interlayer insulating films that form the multilayered wiring layer 29 is formed of a material whose relative dielectric constant is equal to or less than 3.4.

For example, at the first wiring layer 31-1 formed on the first interlayer insulating film 30-1, the dummy wirings 311B electrically disconnected are disposed so as to surround the wiring 311A that actually applies current. The second interlayer insulating film 30-2 laminated with a silicon nitride film 302A (relative dielectric constant=7.0) and a low dielectric constant film 302B formed of a material whose relative dielectric constant is equal to or less than 3.4, is formed on the first wiring layer 31-1. A via hole is formed in the second interlayer insulating film 30-2 so as to expose a part where the wiring 311A is provided, and the via 351 is disposed within. The second wiring layer 31-2 that includes the wiring 312A and the dummy wirings 312B provided so as to surround the wiring 312A, is formed on a predetermined region including the via 351 of the second interlayer insulating film 30-2.

Similar to the second interlayer insulating film 30-2, the third interlayer insulating film 30-3 laminated with a silicon nitride film 303A and a low dielectric constant film 303B is formed on the second wiring layer 31-2. A via hole is formed in the third interlayer insulating film 30-3, so as to expose a part where the wiring 312A is provided, and the via 352 is disposed within. The third wiring layer 31-3 that includes the wiring 313A and the dummy wirings 313B provided so as to surround the wiring 313A is formed on a predetermined region including the via 352 of the third interlayer insulating film 30-3. The fourth interlayer insulating film 30-4 laminated with a silicon nitride film 304A and a silicon oxide film 304B is formed thereon, and pads used to connect external connection terminals, which are not shown, are provided above the fourth interlayer insulating film 30-4. At this time, as explained in the embodiments, the wirings 311A, 312A, and 313A, and the dummy wirings 311B, 312B, and 313B are disposed so as to mutually interpolate between the wirings, to shield unnecessary light entering from the side opposite to the light-receiving surface.

The wirings 311A, 312A, 313A, the vias 351 and 352, and the dummy wirings 311B, 312B, and 313B are made of a barrier metal arranged along a predetermined position on the front surfaces of the interlayer insulating films 30-1 through 30-3, and a conductive material formed on the barrier metal. A metal such as tantalum (Ta), titanium (Ti), niobium (Nb), tungsten (W), ruthenium (Ru), and rhodium (Rh), an alloy including thereof, chemical compounds thereof, or a laminated film thereof may be used as the barrier metal. A metal such as Cu and Al, or an alloy including thereof may be used as the conductive material.

As the low dielectric constant films 302B and 303B, for example, an organic insulating film such as a polymethyl siloxane film (relative dielectric constant=2.8), a polymer membrane such as hydrogen silsesquioxane, a silicon dioxide ($SiO_2$) film containing carbon (carbon-doped silicon oxide (SiOC) film), a porous silica film, and an amorphous carbon film (F-dope) can be used. All of these materials have a relative dielectric constant equal to or less than 3.4. The low dielectric constant films 302B and 303B may be formed by a laminated film including one or more materials in the low dielectric constant materials.

The silicon nitride film 302A (303A) and the low dielectric constant film 302B (303B) arranged with the wiring 312A (313A) and the via 351 (352) may also be multilayered. Among the multilayered wiring layer 29, the low dielectric constant films 302B and 303B are used for the two layers of the second and the third interlayer insulating films 30-2 and 30-3. However, in the multilayered wiring layer 29, the low dielectric constant film may be used for at least one interlayer insulating film, and an interlayer insulating film whose relative dielectric constant is larger than 3.4 may be used for the other interlayer insulating films.

The result of an experiment on peelability when the wiring coverage of the entire solid-state image pickup apparatus is changed will now be shown. The shapes of the dummy wirings 311B, 312B, and 313B are in dots (substantially square planar shape) as shown in FIG. 8A, and the wiring coverage of the silicon substrate after disposing the dummy wirings viewed from the front surface side, is 100%. A solid-state image pickup apparatus on which the dummy wirings are not disposed is also formed as a comparison. In any structure, the positions and shapes of wirings are the same as those actually used to apply current.

Solid-state image pickup apparatuses having a structure that the wiring coverage is changed by using dummy wirings and a structure without dummy wirings are formed. With each of the solid-state image pickup apparatuses, whether cracks are generated in the insulating film due to the thermal stress and the external stress during processing is observed. As a result, the cracks cannot be observed in the structure in which the wiring coverage viewed from the front surface side is 100%. However, in the structure in which the dummy wirings are not disposed, the cracks were observed in the insulating film at the region where the wirings are not present in a wide range when viewed from the front surface side.

The low dielectric constant film that forms the multilayered wiring layer 29 of the solid-state image pickup apparatus 14 generally has a small Young's modulus of 15 gigapascals. The Young's modulus of Cu used as the wiring layer is 130 gigapascals, and is larger than that of the low dielectric constant film by about one order of magnitude. Accordingly, when thermal stress and external stress are applied to the solid-state image pickup apparatus 14, a difference is generated between the amount of strain near the Cu wiring, and the amount of strain in the low dielectric constant film (insulating film). The difference drives the propagation of cracks in the insulating film. The difference between the strain amounts becomes larger, as the coverage distribution of the Cu wirings in the low dielectric constant film becomes more unequal. When the dummy wirings are not disposed, the coverage distribution of wirings become unequal, and the difference between the strain amounts becomes larger, thereby propagating cracks in the insulating film. By making the wiring coverage viewed from the front surface side to 100%, the coverage distribution of the Cu wirings in the insulating film is made uniform, thereby reducing the difference between the strain amounts. Accordingly, in the structure in which the wiring coverage is 100%, it is possible to prevent cracks from generating in the insulating film, due to the thermal stress and the external stress during processing.

With the fourth embodiment, in the solid-state image pickup apparatus using at least one low dielectric constant film whose relative dielectric constant is equal to or less than 3.4 for the multilayered wiring layer, in the multilayered wiring layer, the dummy wirings electrically disconnected from the effective wiring are disposed, so that the wiring coverage viewed from the side opposite to the light receiving surface reaches 100%, by mutually interpolating the wiring intervals between the plurality of wiring layers. Accordingly, unnecessary light incident on the side opposite to the light-receiving unit is shielded, and the dummy wirings can be advantageously used as a reinforcing material for the insulating film. It is also possible to prevent problems such as cracks in the insulating film and interface debonding, due to deterioration of mechanical strength. As a result, it is possible to use the interlayer insulating film having a low dielectric constant for the multilayered wiring layer 29, thereby advantageously reducing the parasitic capacitance between the multilayered wirings.

In the fourth embodiment, the planar shapes of the dummy wirings are formed substantially in square shapes (dots). However, the similar effect can be obtained by using the other shapes shown in FIGS. 8B and 8C. The shapes and the coverage of the dummy wirings may be changed with each wiring layer, and the dummy wirings with different shapes may be mixed in one wiring layer. In this manner, by changing the shapes and the coverage of the dummy wirings with each wiring layer, it is possible to shield unnecessary light incident on the front surface side, using the dummy wirings having a minimum required coverage. It is also possible to prevent the increase of the parasitic capacitance generated between the multilayered wirings caused by the disposition of the dummy wirings to the minimum.

As described in the above, with the embodiments of the present invention, in the back-illuminated type solid-state image pickup apparatus, it is possible to advantageously prevent light from entering into the photoelectric conversion element from the front surface side, which is the surface opposite to the light-receiving surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image pickup apparatus comprising:
   an image pickup pixel unit in which a plurality of pixels each including a photoelectric conversion element and a field-effect transistor are arranged on a semiconductor substrate so that a light-receiving surface is disposed at a first surface side of the semiconductor substrate;
   a peripheral circuit unit provided at a periphery of the image pickup pixel unit of the semiconductor substrate; and
   a multilayered wiring layer in which a plurality of wiring layers for driving the field-effect transistor of the image pickup pixel unit are laminated at a second surface side of the semiconductor substrate, wherein
   a wiring in each of the wiring layers constituting the multilayered wiring layer is disposed so that a coverage of the wiring located at least in the image pickup pixel unit of the semiconductor substrate reaches 100%, viewed from the second surface side,
   further comprising a wall-shaped via ring disposed at a periphery of the multilayered wiring layer formed in the image pickup pixel unit, the via ring being formed of a material capable of shielding light having a wavelength equal to or more than a wavelength of ultraviolet light.

2. The apparatus according to claim 1 wherein, when a region not covered by the wiring is included in a region other than the image pickup pixel unit of the semiconductor substrate, viewed from the second surface side, the wiring in each of the wiring layers constituting the multilayered wiring layer is disposed so that a distance between adjacent wirings sandwiching the region not covered by the wiring becomes equal to or less than a shortest wavelength of ultraviolet light.

3. The apparatus according to claim 2, wherein at least one layer of an interlayer insulating film constituting the multilayered wiring layer is formed of a low dielectric constant material that has a relative dielectric constant equal to or less than 3.4.

4. The apparatus according to claim 2, wherein the wiring in each of the wiring layers is disposed so that the coverage of the wiring reaches 100% in the region other than the image pickup pixel unit, viewed from the second surface side.

5. The apparatus according to claim 1, wherein the wiring in each of the wiring layers includes
   an actual wiring used to drive the field-effect transistor of the image pickup pixel unit, and
   a dummy wiring provided so that the coverage of the wiring in the image pickup pixel unit reaches 100%, viewed from the second surface side.

6. The apparatus according to claim 5, wherein the dummy wiring has any of a nearly square dot shape, a line-and-space shape in which a rectangular wiring extended in one direction is disposed in a predetermined interval, and a grid-like shape.

7. The apparatus according to claim 1, wherein the semiconductor substrate has a thickness equal to or less than 10 micrometers.

8. A solid-state image pickup apparatus comprising:
   an image pickup pixel unit in which a plurality of pixels each including a photoelectric conversion element and a field-effect transistor are arranged on a semiconductor substrate so that a light-receiving surface is disposed at a first surface side of the semiconductor substrate;
   a peripheral circuit unit provided at a periphery of the image pickup pixel unit of the semiconductor substrate; and
   a multilayered wiring layer in which a plurality of wiring layers for driving the field-effect transistor of the image pickup pixel unit are laminated at a second surface side of the semiconductor substrate, wherein
   a wiring in each of the wiring layers constituting the multilayered wiring layer is disposed so that a distance between adjacent wirings constituting the multilayered wiring layer sandwiching a region not covered by the wiring at least in the image pickup pixel unit of the semiconductor substrate becomes equal to or less than a shortest wavelength of ultraviolet light, viewed from the second surface side,
   further comprising a wall-shaped via ring disposed at a periphery of the multilayered wiring layer formed in the image pickup pixel unit, the via ring being formed of a material capable of shielding light having a wavelength equal to or more than a wavelength of ultraviolet light.

9. The apparatus according to claim 8, wherein, when another region not covered by the wiring is included in a region other than the image pickup pixel unit of the semiconductor substrate, viewed from the second surface side, the wiring in each of the wiring layers constituting the multilayered wiring layer is disposed so that a distance between adjacent wirings sandwiching the another region not covered by the wiring becomes equal to or less than a shortest wavelength of ultraviolet light.

10. The apparatus according to claim 9, wherein at least one layer of an interlayer insulating film constituting the multilayered wiring layer is formed of a low dielectric constant material that has a relative dielectric constant equal to or less than 3.4.

11. The apparatus according to claim 9, wherein the wiring in each of the wiring layers is disposed so that the coverage of the wiring reaches 100% in the region other than the image pickup pixel unit, viewed from the second surface side.

12. The apparatus according to claim 8, wherein the wiring in each of the wiring layers includes
   an actual wiring used to drive the field-effect transistor of the image pickup pixel unit, and
   a dummy wiring provided so that a distance from an adjacent actual wiring or an adjacent dummy wiring in the region not covered by the wiring becomes equal to or less than a shortest wavelength of ultraviolet light, viewed from the second surface side.

13. The apparatus according to claim 12, wherein the dummy wiring has any of a nearly square dot shape, a line-and-space shape in which a rectangular wiring extended in one direction is disposed in a predetermined interval, and a grid-like shape.

14. The apparatus according to claim 8, wherein the semiconductor substrate has a thickness equal to or less than 10 micrometers.

15. A camera module comprising:
a solid-state image pickup apparatus;
a cover glass provided at a first surface side of the solid-state image pickup apparatus; and
a lens unit provided over the cover glass, wherein
the solid-state image pickup apparatus includes
an image pickup pixel unit in which a plurality of pixels each including a photoelectric conversion element and a field-effect transistor are arranged on a semiconductor substrate so that a light-receiving surface is disposed at a first surface side of the semiconductor substrate,
a peripheral circuit unit provided at a periphery of the image pickup pixel unit of the semiconductor substrate,
a multilayered wiring layer in which a plurality of wiring layers for driving the field-effect transistor of the image pickup pixel unit are laminated at a second surface side of the semiconductor substrate,
a microlens provided corresponding to a forming position of the photoelectric conversion element of the image pickup pixel unit at the first surface side of the semiconductor substrate, and
a light-shielding film formed corresponding to a forming position of the peripheral circuit unit at the first surface side of the semiconductor substrate, and wherein
a wiring in each of the wiring layers constituting the multilayered wiring layer of the solid-state image pickup apparatus is disposed so that a distance between adjacent wirings constituting the multilayered wiring layer sandwiching a region not covered by the wiring at least in the image pickup pixel unit of the semiconductor substrate becomes equal to or less than a shortest wavelength of ultraviolet light, viewed from the second surface side,
wherein the solid-state image pickup apparatus further includes a wall-shaped via ring disposed at a periphery of the multilayered wiring layer formed in the image pickup pixel unit, the via ring being formed of a material capable of shielding light having a wavelength equal to or more than a wavelength of ultraviolet light.

16. The module according to claim 15, wherein the wiring in each of the wiring layers constituting the multilayered wiring layer is disposed so that a coverage of the wiring located at least in the image pickup pixel unit of the semiconductor substrate reaches 100%, viewed from the second surface side.

17. The module according to claim 15, wherein, when another region not covered by the wiring is included in a region other than the image pickup pixel unit of the semiconductor substrate, viewed from the second surface side, the wiring in each of the wiring layers constituting the multilayered wiring layer is disposed so that a distance between adjacent wirings sandwiching the another region not covered by the wiring becomes equal to or less than a shortest wavelength of ultraviolet light.

* * * * *